United States Patent [19]

Brown et al.

[11] Patent Number: 5,440,248
[45] Date of Patent: Aug. 8, 1995

[54] POWER-SAVER DIFFERENTIAL INPUT BUFFER

[75] Inventors: Brian L. Brown, Missouri City; David R. Brown, Sugarland, both of Tex.

[73] Assignee: Texas Instruments Incorporated, Dallas, Tex.

[21] Appl. No.: 189,222

[22] Filed: Jan. 31, 1994

[51] Int. Cl.⁶ ............................................. H03K 19/094
[52] U.S. Cl. ........................................ 326/71; 326/121
[58] Field of Search .................. 307/443, 451, 465, 47

[56] References Cited

U.S. PATENT DOCUMENTS

| | | | |
|---|---|---|---|
| 4,472,647 | 9/1984 | Allgood et al. | 307/475 |
| 4,504,747 | 3/1985 | Smith et al. | 307/475 |
| 4,527,079 | 7/1985 | Thompson | 307/475 |
| 4,563,601 | 1/1986 | Asano et al. | 307/475 |
| 4,612,460 | 9/1986 | Gloaguen et al. | 307/443 X |
| 4,707,623 | 11/1989 | Bismarck | 307/443 X |

Primary Examiner—David R. Hudspeth
Attorney, Agent, or Firm—Robert N. Rountree; Richard B. Havill; Richard L. Donaldson

[57] ABSTRACT

An input circuit designed for a semiconductor device. A first input buffer (14) receives a control signal $\overline{EN}$, an input signal IN, and a reference signal VREF, for producing a first output signal $OUT_1$ in response the control signal and a difference between the input signal and the reference signal. A second input buffer (16) receives the control signal and the input signal, for producing a second output signal $OUT_2$ in response to the control signal and the input signal. A control circuit (22) produces the control signal, in response to a predetermined output state.

19 Claims, 2 Drawing Sheets

POWER-SAVER DIFFERENTIAL INPUT BUFFER

FIELD OF THE INVENTION

This invention relates to integrated circuits and more particularly to input buffer circuits.

BACKGROUND OF THE INVENTION

Present complementary metal oxide semiconductor (CMOS) circuits are frequently used for a variety of computer applications including lap top and notebook computer systems which are battery powered. These applications impose practical limitations such as speed, power, and feature size on semiconductor design. Optimal performance of a system depends on an effective balance of these factors.

Input buffers in semiconductors such as dynamic random access memories (DRAM) act as an interface between external input signals and internal logic circuits. Input buffer designs, as disclosed in FIGS. 126, 138, and 139 of U.S. Pat. No. 5,208,776, entitled PULSE GENERATION CIRCUIT, translate external transistor-transistor logic (TTL) logic level signals to internal logic level signals. These TTL input buffers are designed to minimize operating power consumption during a standby mode. However, they are sensitive to transistor threshold voltage variation. Therefore, TTL input buffer speed degrades significantly with variations in operating voltage and temperature. Furthermore, the ability of the TTL input buffer to correctly determine an external input signal level may degrade significantly due to internal noise on supply voltage bus lines during an active mode.

Differential input buffers disclosed in U.S. Pat. No. 4,280,070, entitled BALANCED INPUT BUFFER CIRCUIT FOR SEMICONDUCTOR MEMORY, and U.S. Pat. No. 4,288,706, entitled NOISE IMMUNITY IN INPUT BUFFER CIRCUIT FOR SEMICONDUCTOR MEMORY, compare external logic signals to a stable internal reference signal to produce an internal logic level signal. These differential input buffers offer greater speed and noise immunity than TTL input buffers. However, use of differential input buffers greatly increases operating power consumption during a standby mode.

SUMMARY OF THE INVENTION

These issues are resolved by an input circuit for a semiconductor device. A first input buffer receives a control signal, an input signal, and a reference signal, for producing a first output signal in response the control signal and a difference between the input signal and the reference signal. A second input buffer receives the control signal and the input signal, for producing a second output signal in response to the control signal and the input signal. A control circuit produces the control signal, in response to a predetermined output state.

The present invention provides high speed operation and excellent noise immunity during an active mode. Noise immunity is uncompromised during a standby mode when internal noise is negligible. Power is conserved over previous methods in a standby mode.

BRIEF DESCRIPTION OF THE DRAWINGS

A more complete understanding of the invention may be gained by reading the subsequent detailed description with reference to the drawings wherein.

DETAILED DESCRIPTION OF THE PREFERRED EMBODIMENTS

Figure 1:
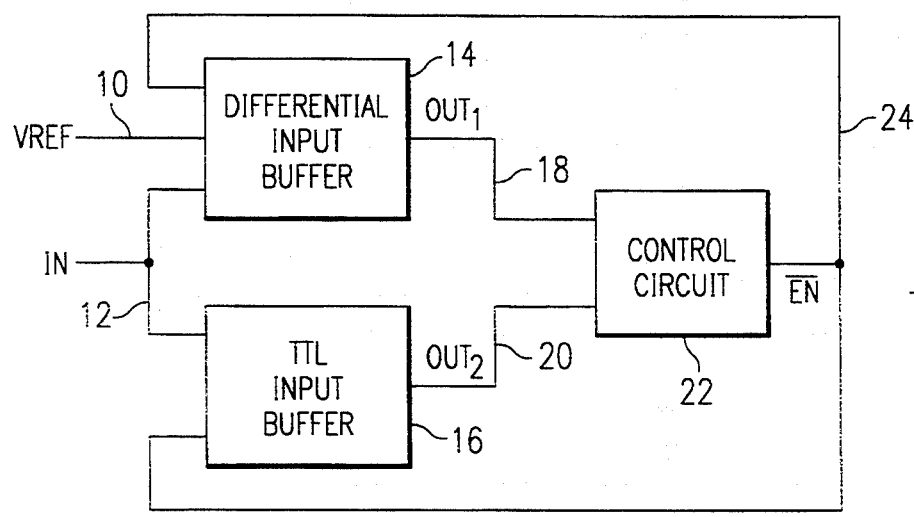
FIG. 1 is block diagram of a first embodiment of the present invention.

Referring now to FIG. 1, a first embodiment of the input circuit will be described in detail. Differential input buffer 14 receives input signal IN, reference signal VREF, and control signal $\overline{EN}$, for producing a first output signal $OUT_1$. TTL input buffer 16 receives input signal IN and control signal $\overline{EN}$, for producing a second output signal $OUT_2$. Control circuit 22 has input terminals 18 and 20 for receiving output signals $OUT_1$ and $OUT_2$, respectively. Control circuit 22 produces control signal $\overline{EN}$ at terminal 24 having low and high logic states corresponding to active and standby modes, respectively, of the semiconductor device.

Input signal IN is low and control signal $\overline{EN}$ is high in a standby mode. Differential input buffer 14 is disabled, TTL input buffer 16 is enabled, and output signals $OUT_1$ and $OUT_2$ are high and low, respectively. Thus, no power is consumed by differential input buffer 14. Internal noise is negligible in standby mode while TTL input buffer 16 is enabled, so noise immunity is uncompromised.

At the beginning of an active mode, input signal IN goes high causing output signal $OUT_2$ to go high. Control signal $\overline{EN}$ goes low in response to this predetermined output state, thereby enabling differential input buffer 14 and disabling TTL input buffer 16. Output signal $OUT_2$ is reset low. Furthermore, control signal $\overline{EN}$ enables other circuits (not shown) on the semiconductor device for operation in the active mode. Thus, excellent noise immunity and high speed of the differential input buffer are operative during the active mode. Power consumption of differential input buffer 16 is negligible with respect to total power consumption during the active mode.

At the beginning of a standby mode, input signal IN goes low causing output signal $OUT_1$ to go low. Control signal $\overline{EN}$ goes high in response to this predetermined output state, thereby disabling differential input buffer 14 and enabling TTL input buffer 16.

Figure 2:
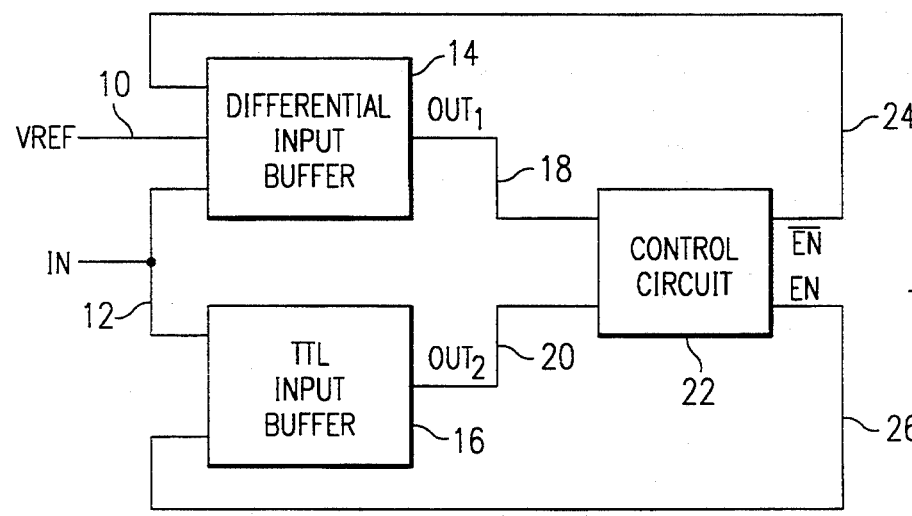
FIG. 2 is block diagram of a second embodiment of the present invention.

Referring now to FIG. 2, a second embodiment of the input circuit will be described in detail. Differential input buffer 14 receives input signal IN, reference signal VREF, and control signal $\overline{EN}$, for producing a first output signal $OUT_1$. TTL input buffer 16 receives input signal IN and control signal EN, for producing a second output signal $OUT_2$. Control circuit 22 has input terminals 18 and 22 for receiving output signals $OUT_1$ and $OUT_2$, respectively. Control circuit 22 produces complementary control signals $\overline{EN}$ and EN at terminals 24 and 26, respectively. Furthermore, control signal $\overline{EN}$ enables other circuits (not shown) on the semiconductor device for operation in the active mode. Thus, operation of the input circuit is similar to that of the previous embodiment except that TTL input buffer 16 is enabled when control signal EN at terminal 26 is low. This is effected by substitution of a NOR gate for a NAND gate in TTL input buffer 16, as is well known by those having ordinary skill in the art.

Figure 3:
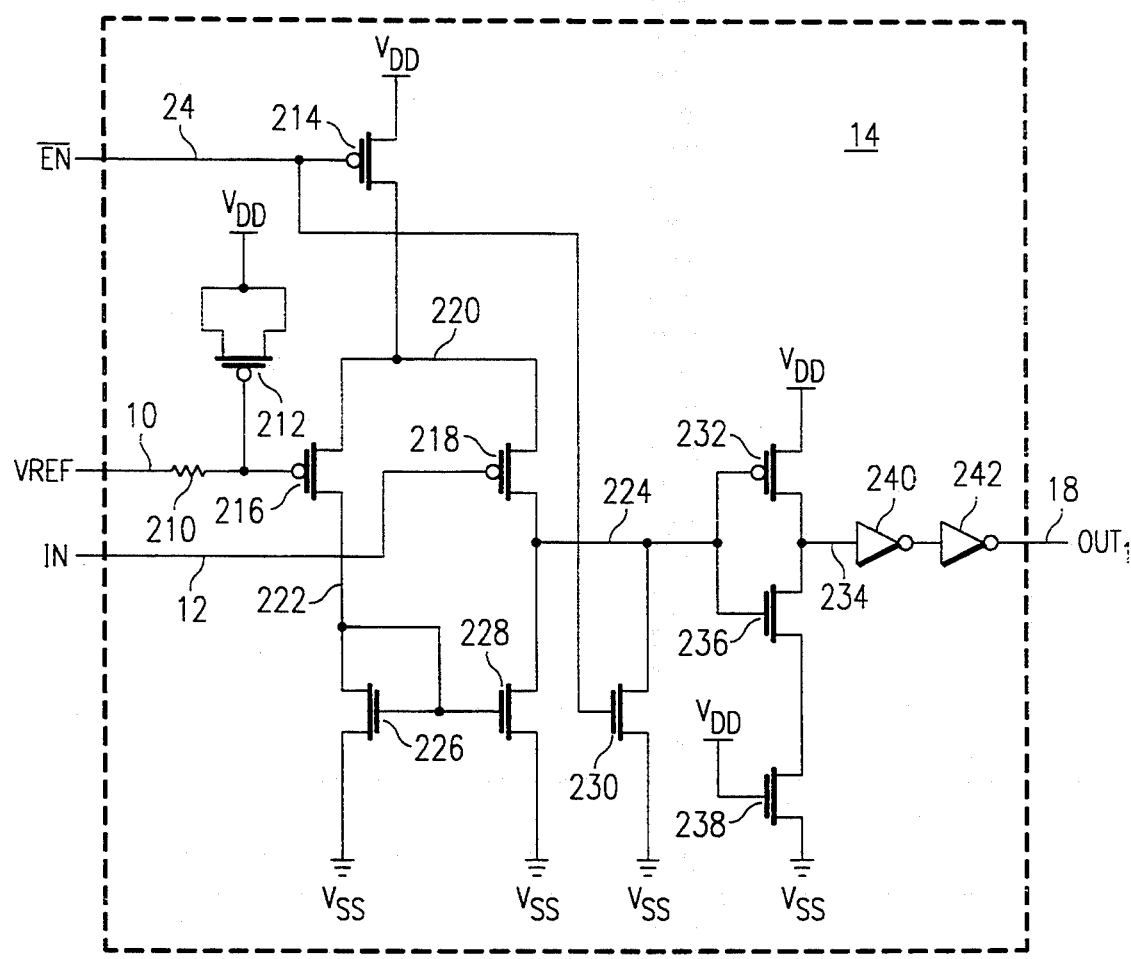
FIG. 3 is a differential input buffer which may be used in FIGS. 1 and 2.

Referring now to FIG. 3, a differential input buffer which may be used in the input circuit of FIGS. 1 and 2 will be described in detail. N-channel current mirror transistors 226 and 228 are connected to P-channel input transistors 216 and 218, respectively, to form a differential amplifier. The common source of P-channel input transistors 216 and 218 is connected to positive supply $V_{DD}$ through P-channel transistor 214. Reference signal VREF is coupled to the gate of P-channel input transistor 216 through resistor 210. Resistor 210 and P-channel capacitor 212 stabilize the gate voltage of P-channel input transistor 216. Input signal 12 is coupled to the gate of P-channel input transistor 218. The output of the differential amplifier at terminal 224 is coupled to the input of a high threshold inverter formed by P-channel transistor 232 and N-channel transistors 236 and 238. The output of the high threshold inverter at terminal 234 is buffered by inverters 240 and 242 to produce output signal $OUT_1$.

When control signal $\overline{EN}$ is high, P-channel transistor 214 is off and N-channel transistor 230 is on. Thus, the differential amplifier is disabled, input terminal 224 of the high threshold inverter is low and output signal $OUT_1$ is high.

When control signal $\overline{EN}$ goes low, P-channel transistor 214 is on, N-channel transistor 230 is off, and the differential amplifier is enabled. Input signal IN is compared with reference signal VREF by P-channel input transistors 218 and 216, respectively. If input signal IN is greater than reference signal VREF, P-channel input transistor 218 is less conductive than P-channel input transistor 216, and the output at terminal 224 goes low causing output signal $OUT_1$ to go high. If input signal IN is less than reference signal VREF, output signal $OUT_1$ goes low.

Figure 4:
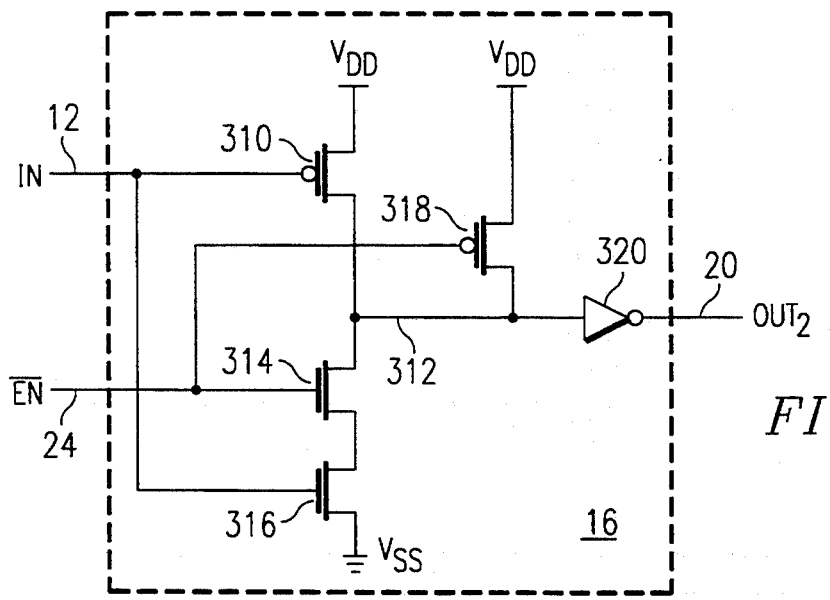
FIG. 4 is a TTL input buffer which may be used in FIG. 1; 15

Referring now to FIG. 4, a TTL input buffer which may be used in the input circuit of FIG. 1 will be described in detail. A two input NAND gate is formed by P-channel transistors 310 and 318 and N-channel transistors 314 and 316. The output of the NAND gate at terminal 312 is coupled to the input of buffering inverter 320, which produces output signal $OUT_2$.

When control signal $\overline{EN}$ is low, P-channel transistor 318 is on and N-channel transistor 314 is off. Thus, the NAND gate is disabled, and output signal $OUT_2$ is low. When control signal $\overline{EN}$ goes high, P-channel transistor 318 is off and N-channel transistor 314 is on. Thus, the NAND gate is enabled, and output signal $OUT_2$ is the same logic state as input signal IN.

Figure 5:
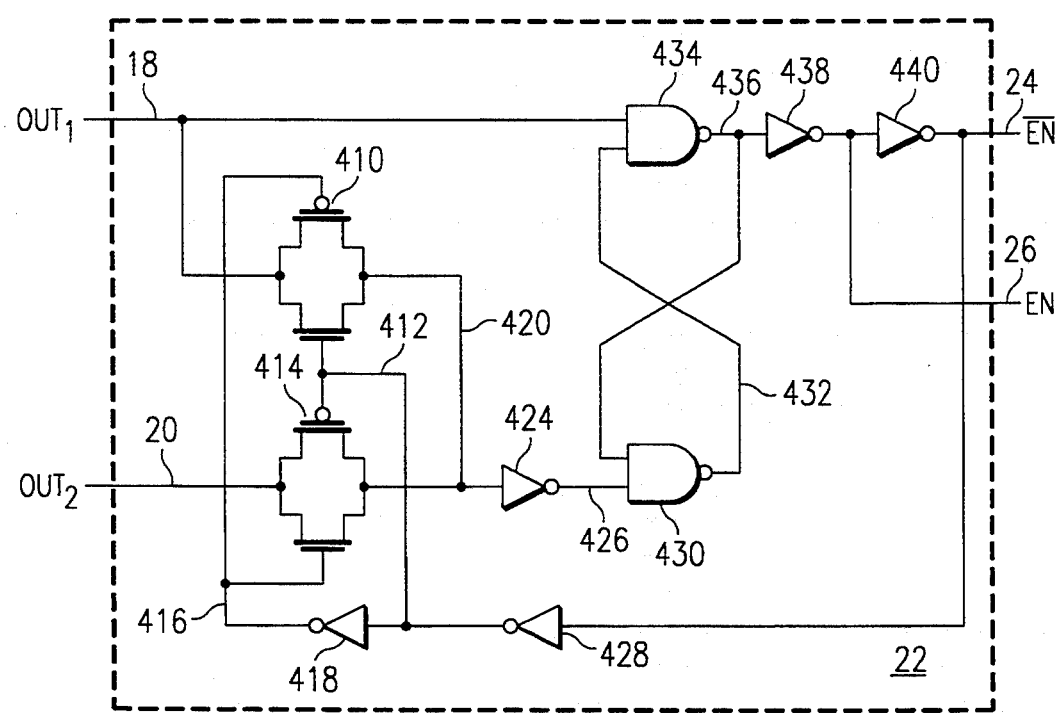
FIG. 5 is a control circuit which may be used in FIGS. 1 and 2.

Referring now to FIG. 5, a control circuit which may be used in the input circuit of FIGS. 1 and 2 will be described in detail. Output signal $OUT_1$ is coupled to one input terminal 18 of a cross-coupled latch formed by NAND gates 434 and 430. Output signals $OUT_1$ and $OUT_2$ are coupled by CMOS pass gates 410 and 414, respectively, to the input of inverter 424. The output of inverter 424 is coupled to the other input of the cross-coupled latch at terminal 426. An output of the cross-coupled latch at terminal 436 is buffered by inverters 438 and 440 to produce control signal $\overline{EN}$ at terminal 24. Control signal $\overline{EN}$ is fed back to the gates of CMOS pass gates 410 and 414 through inverters 428 and 418.

When control signal $\overline{EN}$ is high in a standby mode, CMOS pass gate 410 is off and CMOS pass gate 414 is on. When input signal IN (FIG. 1) goes high at the beginning of an active mode, output signal $OUT_2$ goes high, and the cross-coupled latch is reset when terminal 426 goes low. Both inputs of NAND gate 434 are high and control signal $\overline{EN}$ goes low, thereby enabling the differential input buffer 14 and disabling the TTL input buffer 16 (FIG. 1). Thus, noise immunity of the input circuit of FIG. 1 is greatly improved, because the signal level of input signal IN is determined by comparison with reference signal VREF. Common mode noise on supply voltage bus line $V_{SS}$ (FIG. 3) has little effect on the differential input buffer operation. Input circuit speed is improved, because a small change of input signal IN with respect to reference signal VREF will effect a change in output signal $OUT_1$.

Referring again to FIG. 5, when control signal $\overline{EN}$ is low in an active mode, CMOS pass gate 410 is on and CMOS pass gate 414 is off. When input signal IN (FIG. 1) goes low at the beginning of a standby mode, output signal $OUT_1$ is immediately driven low by differential input buffer 14. The cross-coupled latch (FIG. 5) is set, and control signal $\overline{EN}$ goes high, thereby disabling the differential input buffer and enabling the TTL input buffer (FIG. 1). Thus, power consumption is greatly reduced in the standby mode. Noise is negligible in the standby mode, and noise immunity is uncompromised.

Although the invention has been described in detail with reference to its preferred embodiment, it is to be understood that this description is by way of example only and is not to be construed in a limiting sense. It is to be further understood that numerous changes in the details of the embodiments of the invention will be apparent to persons of ordinary skill in the art having reference to this description. For example, in another embodiment TTL input buffer 14 remains enabled during both active and standby modes. In yet another embodiment, control signal $\overline{EN}$ is a logic function of output signal $OUT_2$ only. It is contemplated that such changes and additional embodiments are within the spirit and true scope of the invention as claimed below.

What is claimed:

1. An input circuit for a semiconductor device, the circuit comprising:
   a first input buffer, coupled to receive a control signal, an input signal, and a reference signal, for producing a first output signal in response to the control signal and a difference between the input signal and the reference signal;
   a second input buffer, coupled to receive the control signal and the input signal, for producing a second output signal in response to the control signal and the input signal; and
   a control circuit, for producing the control signal, in response to a predetermined output state of at least one of the first or second output signals.

2. The circuit of claim 1, wherein the predetermined output state is a logical function of the first and second output signal.

3. The circuit of claim 2, wherein the control signal has a first logic state and a second logic state.

4. The circuit of claim 3, wherein the first input buffer is enabled by the first logic state of the control signal and the second input buffer is enabled by the second logic state of the control signal.

5. The circuit of claim 4, wherein the second input buffer is a TTL input buffer.

6. The circuit of claim 1, wherein the predetermined output state is a logical function of the second output signal.

7. An input circuit for a semiconductor device, the circuit comprising:
- a first input buffer, coupled to receive a first control signal, an input signal, and a reference signal, for producing a first output signal in response to the first control signal and a difference between the input signal and the reference signal;
- a second input buffer, coupled to receive a second control signal and the input signal, for producing a second output signal in response to the second control signal and the input signal; and
- a control circuit, for producing the first and second control signals, in response to a predetermined output state of at least one of the first or second output signals.

8. The circuit of claim 7, wherein the predetermined output state is a logical function of the first and second output signals.

9. The circuit of claim 8, wherein the first control signal is a complement of the second control signal.

10. The circuit of claim 9, wherein the first input buffer is enabled by the first control signal and the second input buffer is enabled by the second control signal.

11. The circuit of claim 10, wherein the second input buffer is a TTL input buffer.

12. An input circuit for a semiconductor device, the circuit comprising:
- a first input buffer, coupled to receive a control signal, an input signal, and a reference signal, for producing a first output signal in response to the control signal and a difference between the input signal and the reference signal;
- a second input buffer, coupled to receive the input signal, for producing a second output signal in response to the input signal; and
- a control circuit, for producing the control signal, in response to a predetermined output state of at least one of the first or second output signals.

13. The circuit of claim 12, wherein the predetermined output state is a logical function of the second output signal.

14. The circuit of claim 13, wherein the control signal has a first logic state and a second logic state.

15. The circuit of claim 14, wherein the first input buffer is enabled by the first logic state and disabled by the second logic state.

16. The circuit of claim 15, wherein the second input buffer is a TTL input buffer.

17. The circuit of claim 12, wherein the predetermined output state is a logical function of the first and second output.

18. A method of reducing power consumption in a semiconductor device, comprising the steps of:
- enabling a first input buffer with a control signal during an active mode for producing a first output signal in response to a difference between an input signal and a reference signal;
- disabling the first input buffer with the control signal during a standby mode;
- producing a second output signal from a second input buffer during the standby mode, in response to the input signal; and
- producing the control signal, in response to a predetermined output state of at least one of the first or second output signals.

19. A method, as in claim 18, further including the steps of:
- disabling the second input buffer when the first input buffer is enabled; and
- enabling the second input buffer when the first input buffer is disabled.

* * * * *